United States Patent [19]

Hasegawa et al.

[11] Patent Number: 5,648,672
[45] Date of Patent: Jul. 15, 1997

[54] SEMICONDUCTOR DEVICE WITH OUTER DIFFUSION LAYER

[75] Inventors: Masahiro Hasegawa, Fukuyama; Junichi Tanimoto, Ikoma, both of Japan

[73] Assignee: Sharp Kabushiki Kaisha, Osaka, Japan

[21] Appl. No.: 529,977

[22] Filed: Sep. 19, 1995

[30] Foreign Application Priority Data

May 24, 1995 [JP] Japan ..................... 7-125175

[51] Int. Cl.$^6$ ..................................... H01L 29/76
[52] U.S. Cl. .................. 257/372; 257/373; 257/375; 257/390; 257/399; 257/408
[58] Field of Search ................. 257/373, 399, 257/390, 371, 372, 375, 335, 408

[56] References Cited

U.S. PATENT DOCUMENTS

| | | | |
|---|---|---|---|
| 4,929,992 | 5/1990 | Thomas et al. | 257/371 X |
| 4,968,639 | 11/1990 | Bergonzoni | 257/371 X |
| 5,338,960 | 8/1994 | Beasom | 257/408 X |
| 5,514,902 | 5/1996 | Kawasaki et al. | 257/408 X |

Primary Examiner—William Mintel
Attorney, Agent, or Firm—Nixon & Vanderhye P.C.

[57] ABSTRACT

A semiconductor device comprises a semiconductor substrate formed with at least one well containing impurity ions of either a first conductivity type or a second conductivity type; a plurality of transistors each having a gate insulation film formed on the well, a gate electrode formed on the gate insulation film and a pair of diffusion layers formed in the well; and an outer diffusion layer of the same conductivity type as that of the well and self-aligned with each of the diffusion layers in an outer periphery thereof within the well; the outer diffusion layer having an impurity concentration sufficient to provide a desired junction withstand voltage and having substantially the same width as that of a depletion layer to be generated when an operational voltage is applied to the corresponding transistor; the impurity of the well being set for a concentration such that a threshold voltage of a parasitic transistor appearing below the gate electrode connecting adjacent transistors is higher than a power supply voltage, whereby the adjacent transistors are isolated from each other.

4 Claims, 12 Drawing Sheets

SEMICONDUCTOR DEVICE WITH OUTER DIFFUSION LAYER

BACKGROUND OF THE INVENTION

1. Field of the Invention

The present invention relates to semiconductor devices, mask ROMs and fabrication methods therefor. More particularly, the invention relates to semiconductor devices in which the device isolation is achieved without utilizing LOCOS films, and mask ROMs incorporating such semiconductor devices in peripheral circuitry thereof. The invention further relates to fabrication methods for such semiconductor devices and mask ROMs.

2. Description of Related Art

In MOS devices, device isolation is achieved by utilizing PN junction and/or low dielectric film. This device isolation technology is employed to prevent a reduction in the breakdown voltage of a device due to punch-through and the channel formation of a parasitic transistor caused by gate interconnection or metallization.

As shown in FIG. 17, a conventional mask ROM includes a memory cell array (flat cell) M employing PN junction isolation and a peripheral circuitry C employing LOCOS isolation film 47. With reference to FIG. 17, a method for fabricating the conventional mask ROM will be described.

An N-well 41 and a P-well 42 each having a surface impurity concentration of about $1 \times 10^{17}/cm^3$ are formed in a silicon substrate 40. An oxide film and a silicon nitride film are then formed on an entire surface of the silicon substrate 40. A resist pattern having a window on a region in which an LOCOS film is to be formed is formed on the substrate 40 by conventional photolithography and etching techniques. The silicon nitride film is patterned by using the resist pattern as a mask.

After the resist pattern is removed, a resist pattern is formed on the substrate 40 so as to cover only the N-well 41. By using the resist pattern and the silicon nitride film as masks, boron ions are implanted into the silicon substrate 40 in a dose of about $7 \times 10^{13}/cm^2$ at an implantation energy of about 15 KeV to form a channel stopper just below the region provided for the LOCOS film formation.

After the resist pattern is removed, pyrolytic oxidation is carried out at a temperature of about 950° C. by using the silicon nitride film as a mask to form LOCOS film 47 having a thickness of about 600 nm. At this time, channel stopper 48 is formed just below the LOCOS film 47 in the P-well 41.

In turn, the silicon nitride film is removed by using hot phosphoric acid. A resist pattern is formed to cover the N-well 41, and then boron ions are implanted into the substrate in a dose of about $2.5 \times 10^{12}/cm^2$ at an implantation energy of 20 KeV by using the resist pattern as a mask to adjust the threshold voltage of an N-channel transistor to be formed in the N-well 42.

After the resist pattern is removed, a resist pattern is formed to cover the P-well 42, and then boron ions are implanted into the substrate in a dose of about $3 \times 10^{12}/cm^2$ at an implantation energy of about 20 KeV to adjust the threshold voltage of a P-channel transistor to be formed in the N-well 41. In turn, the resist pattern is removed, and arsenic ions are implanted into the substrate masked with another resist pattern in a dose of about $2.0 \times 10^{15}/cm^2$ at an implantation energy of about 40 KeV. After the resist pattern is removed, the substrate is annealed at a temperature of about 900° C. for about 30 minutes to achieve diffused bit line connections in the memory cell array M.

In turn, a gate electrode 52 is formed by conventional process. The substrate 40, which is masked with a photoresist in the peripheral circuitry C and with the gate electrode 52 in the memory cell array M, is implanted with boron ions in a dose of about $3 \times 10^{13}/cm^2$ at an implantation energy of about 20 KeV to form junction isolation for isolating the diffused bit line connections from each other.

After removing the photoresist, an oxide film is deposited to a thickness of about 250 nm, and etched back for the formation of spacers 55 on sidewalls of the gate electrode 52. With photoresists for respectively masking the N-well 41 and the P-well 42, a $P^+$ diffusion layer 56 and an $N^+$ diffusion layer 57 are formed in the peripheral circuitry C.

In turn, boron ions are implanted into desired channel regions in the memory cell array in a dose of about $2 \times 10^{14}/cm^2$ at an implantation energy of about 180 KeV by using a photoresist as a mask for the programming of the ROM. Thus, transistors having a high threshold voltage are formed.

After the photoresist is removed, interlayer insulation films 60 and 61, contact holes and metal wiring 62 are formed by conventional processes. Thus, the mask ROM is completed.

As can be understood from the foregoing, the process of the LOCOS isolation in the peripheral circuitry C of the mask ROM occupies about 10% to about 15% of the overall mask ROM production process, and takes three to four days, resulting in prolonged production period and costly production. Further, the LOCOS isolation roughens the substrate surface. This hinders microfabrication and thereby results in a reduced yield.

To cope with this problem, U.S. Pat. No. 4,458,262 proposes a device isolation method based on junction isolation. This method is implemented as follows.

As shown in FIG. 18, an $N^+$ diffusion layer 71 is formed in a P-type silicon substrate 70. Then, a photoresist 72 is formed on the substrate 70, and boron ions are implanted into the substrate masked with the photoresist 72 in a dose of about $2 \times 10^{14}/cm^2$ to form a $P^+$ diffusion layer 73, as shown in FIG. 19. After the photoresist 72 is removed as shown in FIG. 20, the substrate is subjected to a heat treatment for the activation of the impurities and for the recovery of the crystallinity of the silicon substrate 70 and, thus, the junction isolation is achieved.

The aforesaid PN junction isolation suppresses the reduction in the withstand voltage due to punch-through between diffused bit lines, and prevents the channel inversion of a parasitic transistor which would otherwise be caused by metal wiring. However, a gate insulation film formed in a region just below a gate electrode where the channel inversion of a parasitic transistor should be prevented is very thin. Therefore, the channel inversion of the parasitic transistor caused by the gate electrode cannot be prevented with a presently utilized level of impurity concentration in the well or in the PN junction isolation. Accordingly, the PN junction isolation cannot be employed for the device isolation in the peripheral circuitry.

The PN junction isolation is required to have a high impurity concentration for the prevention of the channel inversion of the parasitic transistor caused by the gate electrode. The gate electrode disposed in contact with the diffusion layer, however, leads to an increase in the junction capacitance and a reduction in the junction breakdown voltage.

For example, the junction breakdown voltage decreases with increasing impurity concentration at a PN junction isolation surface, as shown in FIG. 3. Therefore, where the impurity concentration at the PN junction isolation surface is higher than about $3\times10^{17}/cm^3$ in a device operable at a voltage of 5 V, it is impossible to provide a junction breakdown voltage of higher than 6 V. To ensure a junction breakdown voltage of at least 6 V while allowing the PN junction isolation to have a relatively high surface impurity concentration, e.g., $1\times10^{18}/cm^3$, the PN junction isolation should be spaced apart from the diffusion layer by not less than 0.4 μm, as shown in FIG. 21. In consideration of a necessary overlap margin and the lateral diffusion of impurity from the junction isolation, the spacing between the PN junction isolation and the diffusion layer should be not less than 0.6 μm as shown in FIG. 22. This leads to limited microfabrication of the device.

SUMMARY OF THE INVENTION

In accordance with one aspect of the present invention, there is provided a semiconductor device which comprises: a semiconductor substrate formed with at least one well containing impurity ions of either a first conductivity type or a second conductivity type; a plurality of transistors each having a gate insulation film formed on the well, a gate electrode formed on the gate insulation film and a pair of diffusion layers formed in the well; and an outer diffusion layer of the same conductivity type as that of the well and self-aligned with each of the diffusion layers in an outer periphery thereof within the well; the outer diffusion layer having an impurity concentration sufficient to provide a desired junction breakdown voltage and having substantially the same width as that of a depletion layer to be generated when an operational voltage is applied to the corresponding transistor; the impurity of the well being set for a concentration such that a threshold voltage of a parasitic transistor appearing below the gate electrode connecting adjacent transistors is higher than a power supply voltage, whereby the adjacent transistors are isolated from each other.

In accordance with another aspect of the present invention, there is provided a method for fabricating a semiconductor device which includes the steps of: (i) forming in a semiconductor substrate at least one well of a first conductivity type or a second conductivity type having an impurity concentration such that a threshold voltage of a parasitic transistor appearing below a gate electrode which is to be formed in a later step is higher than a power supply voltage; (ii) forming gate insulation films and gate electrodes on the well, followed by forming diffusion layers in self-alignment with the gate electrodes by using a resist pattern having a desired configuration thereby providing a plurality of transistors; and (iii) implanting impurity ions of a conductivity type different from that of the well into the semiconductor substrate masked with the resist pattern to form an outer diffusion layer of the first conductivity type or the second conductivity type in self-alignment with each of the diffusion layers in an outer periphery thereof within the well, thereby isolating adjacent transistors from each other and allowing the diffusion layers to have a desired junction breakdown voltage.

In accordance with a further aspect of the present invention, there is provided a method for fabricating a mask ROM having a memory cell array region and a peripheral circuitry region, which comprises the steps of: (i) forming in a semiconductor substrate a well of a first conductivity type or a second conductivity type having an impurity concentration such that a threshold voltage of a parasitic transistor appearing below a gate electrode which is to be formed in a later step is higher than a power supply voltage; (i') forming a plurality of diffusion layers parallel to each other only within the well in the memory cell array region; (ii) forming gate insulation films and gate electrodes on the well, followed by forming diffusion layers in self-alignment with the gate electrodes by using a resist pattern having a desired configuration thereby providing a plurality of transistors; (iii) implanting impurity ions of a conductivity type different from that of the well into the semiconductor substrate masked with the resist pattern to form an outer diffusion layer of the first conductivity type or the second conductivity type in self-alignment with each of the diffusion layers in an outer periphery thereof within the well, thereby isolating adjacent transistors and allowing the diffusion layers to have a desired junction breakdown voltage; and (iv) implanting an impurity ions of a conductivity type different from that of the well into regions below desired gate electrodes in the memory cell region thereby writing data in the memory cell.

Therefore, the present invention can provide a highly reliable semiconductor device without LOCOS isolation for isolating adjacent transistors from each other but junction isolation such that the junction breakdown voltage and junction capacitance are suitably controlled to virtually avoid operational problems, and a mask ROM incorporating such a semiconductor device and fabrication methods therefor. Such a semiconductor device can be fabricated at a reduced cost in a shorter period with a higher yield and, in addition, permits highly dense integration.

The foregoing and other objects, features and advantages of the invention will be apparent from the following detailed description of preferred embodiments of the invention as illustrated in accompanying drawings.

DETAILED DESCRIPTION OF THE PREFERRED EMBODIMENTS

Semiconductor substrates to be used for a semiconductor device of the present invention include those which are typically employed for the fabrication of semiconductor devices, mask ROMs and the like, and a preferable example thereof is a silicon substrate. The semiconductor substrate is formed with at least one well containing impurity ions of either P conductivity type or N conductivity type. The size and number of wells are chosen as desired, depending on circuits to be formed on the wells. A single well of P or N conductivity type may be formed as occupying substantially the overall extent of the substrate. Alternatively, a pair of P-well and N-well or two or more P-wells and N-wells are formed for the formation of a complementary circuit or the like on the semiconductor device.

The wells of the semiconductor device of the present invention are formed by implanting the semiconductor substrate with boron ions as a P-type impurity or with arsenic ions or phosphorus ions as an N-type impurity in conventional methods. At this time, the impurity concentration is selected so that the threshold voltage of a parasitic transistor appearing below a gate electrode which connects transistors (which will be described later) to be formed in the well is set higher than a power supply voltage. That is, one of the features of the present invention is that the impurity concentration at the well surface is set to such a high level.

Figure 2:
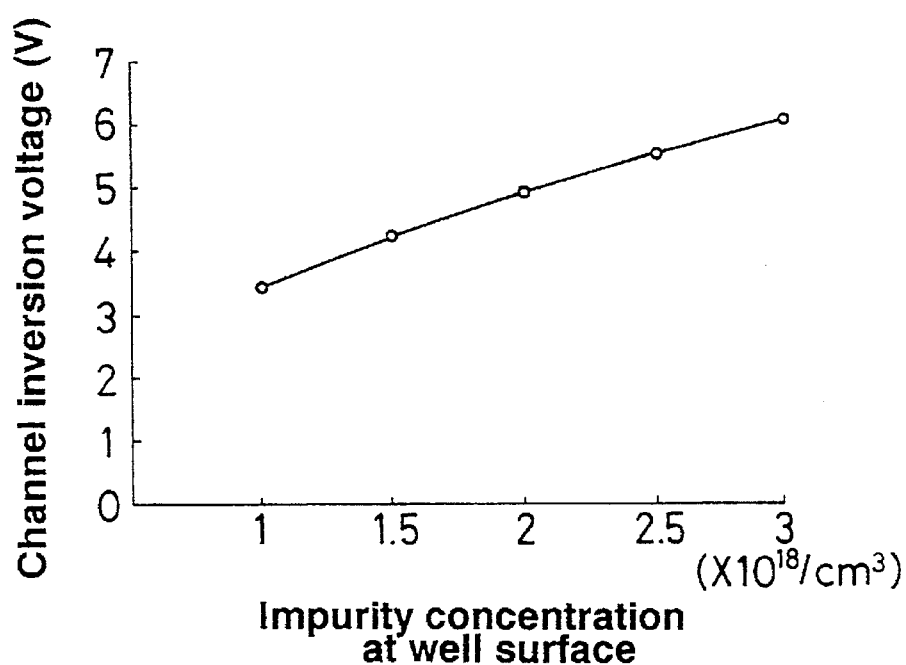
FIG. 2 is a graphical representation illustrating the relationship between the surface impurity concentration of a well and the channel inversion voltage.

If the channel inversion voltage (threshold voltage) of the parasitic transistor below the gate electrode is set higher than a power supply voltage, e.g., not less than 3.3 V, the impurity concentration of the surface area of the well (P-well) in which a MOS operates should be higher than $2 \times 10^{18}/cm^3$, as shown in FIG. 2. If the threshold voltage is set higher than 6 V, the impurity concentration in the well should be higher than $3 \times 10^{18}/cm^3$. The impurity concentration of the well can be adjusted appropriately, depending on the power supply voltage to be used, and preferably adjusted to from about $1 \times 10^{18}/cm^3$ to about $3 \times 10^{18}/cm^3$. The ion-implantation energy is selected so that the impurity ions can be implanted to a depth which allows the well to suitably operate. More specifically, the ion-implantation energy is preferably about 20 KeV to about 180 KeV, though it depends on the species of ions to be employed for the ion-implantation.

Thus, the formation of a well having an impurity concentration higher than a conventional well ensures a high channel inversion voltage, and achieves device isolation without forming the LOCOS isolation film.

The well of the semiconductor device of the present invention serves a plurality of transistors each having a gate insulation film, a gate electrode formed on the gate insulation film and diffusion layers formed within the well. The gate insulation film, gate electrode and diffusion layer are each formed of a known material into a desired size in a known manner. The gate electrode may be provided with sidewall spacers, and the diffusion layers may be of an LDD structure.

An outer diffusion layer of the same conductivity type as that of the well is formed in an outer periphery of each diffusion layer within the well in self-alignment with the diffusion layer. The outer diffusion layer has an impurity concentration sufficient to provide a desired junction breakdown voltage and substantially the same width as that of a depletion layer to be generated when an operational voltage is applied to the transistor. That is, another feature of the present invention is that the outer diffusion layer of the same conductivity type as that of the well is provided within the well having a high impurity concentration.

Figure 4:
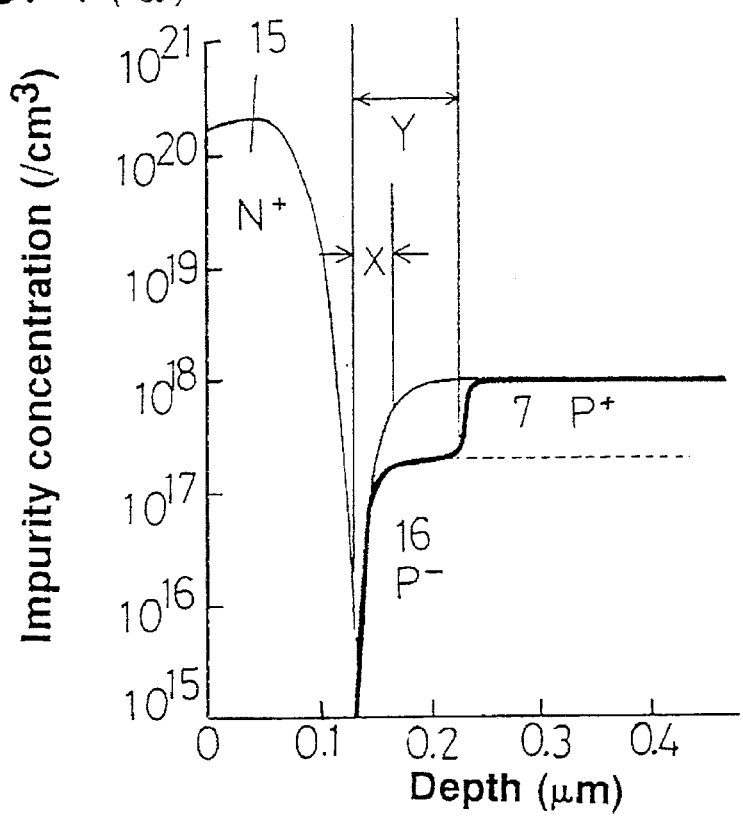
FIGS. 4(a) and 4(b) are graphical representations respectively illustrating the profile of the impurity concentration around a diffusion layer and the relationship between the impurity concentration of an outer diffusion layer, the width of the outer diffusion layer and the junction breakdown voltage.
Figure 4:
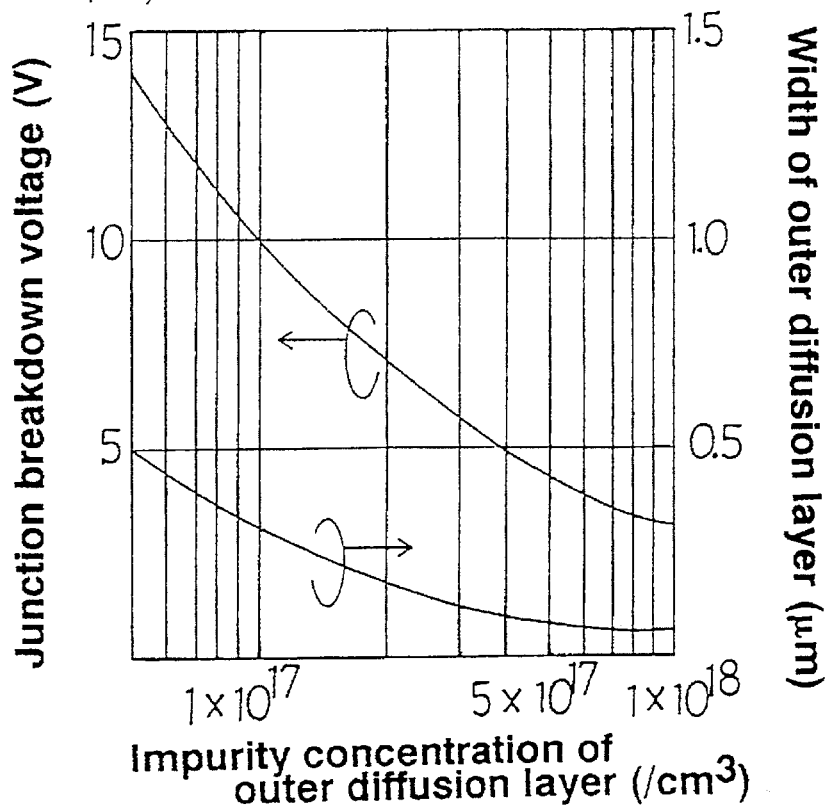

The outer diffusion layer provided in the outer periphery of each diffusion layer of the transistor permits the diffusion layer to have a desired junction breakdown voltage if the impurity concentration and width thereof are adjusted to desired levels as indicated by bold line in FIG. 4(a). Where the impurity concentration of the outer diffusion layer is, for example $1 \times 10^{17}/cm^3$ junction breakdown voltage of 10 V can be attained by adjusting the width of the outer diffusion layer to at least about 0.3 μm, as shown in FIG. 4(a). Further, the width Y of the depletion layer can be extended to substantially the same level as that of the outer diffusion layer by operating the transistor at a voltage of 5 V. Therefore, it is necessary to determine the impurity concentration and width of the outer diffusion layer such that a suitable junction breakdown voltage can be attained in accordance with the operational voltage of the transistor. More specifically, where the power supply voltage is about 5 V, the outer diffusion layer preferably has an impurity concentration of about $3 \times 10^{17}/cm^3$ and a width of about 0.1 μm. At this time, the junction breakdown voltage is 6 V which is sufficient for the operation of the transistor. The width Y of the depletion layer is substantially the same as that of the outer diffusion layer where the transistor is operated at a voltage of 5 V.

The semiconductor device of such a construction is preferably utilized in the peripheral circuitry of a mask ROM and may be used in the peripheral circuitry of a DRAM or SRAM as well. The semiconductor device can otherwise be used in combination with a different kind of device such as a resistor or capacitor. Where the semiconductor device is used in the peripheral circuitry, the semiconductor device may be formed on the substrate on which the memory cell array is formed or, alternatively, on a different substrate.

In a method for fabricating the semiconductor device according to the present invention, at least one P-well or N-well is formed in the semiconductor substrate in the aforesaid manner in step (i).

In step (ii), the gate insulation film and gate electrode are formed on the well. The gate insulation film is preferably formed of $SiO_2$. The gate electrode is formed of a material which is typically employed for the formation of an interconnection layer, such as polysilicon, silicide or polycide, by a known process such as CVD or sputtering. The thicknesses of the gate insulation film and gate electrode are appropriately adjusted depending on the size of the transistor to be formed.

The diffusion layers are formed in self-alignment with the gate electrode by using a resist pattern of a desired configuration and the gate electrode as masks. At this time, the impurity concentration of each diffusion layer is preferably about $1\times10^{20}/cm^3$ to about $1\times10^{21}/cm^3$. Since the diffusion layers are formed in the well having a high impurity concentration, the ion implantation dose is preferably about $2\times10^{15}/cm^2$ to about $5\times10^{15}/cm^2$. The implantation energy is preferably adjusted to about 20 KeV to about 50KeV, which depends on the size of the transistor to be formed and the depth of the diffusion layers. Impurity ions are preferably implanted at an angle of generally 90° with respect to the semiconductor substrate. The diffusion layers may be of an LDD structure which is formed by providing, for example, a sidewall spacers to the gate electrode. In the explanation of the fabrication method of the present invention, the diffusion layers are formed by using the gate electrode as a mask. Alternatively, a plurality of diffusion layers may be formed by using a resist pattern, and then the gate electrode is formed as extending across these diffusion layers.

In step (iii), impurity ions of a conductivity type different from that of the well are implanted into the substrate by using as a mask the resist pattern used when the diffusion layers are formed in the preceding step to form the outer diffusion layer of the same conductivity type as that of the well in self-alignment with each diffusion layer in the outer periphery thereof. At this time, the impurity ions are preferably implanted into the substrate at an angle of about 45° to about 60° with respect to the normal line of a surface of the semiconductor substrate while the substrate is rotated about an axis perpendicular to the surface of the substrate. An implantation angle of less than 45° is not preferable, because the resulting outer diffusion layer does not sufficiently extend laterally of the diffusion layer and therefore is not formed in the overall outer periphery of the diffusion layer. An implantation angle of greater than 60° is not preferable, because the mask or the gate electrode hinders the ion implantation into the substrate and the resulting outer diffusion layer does not extend down to a desired depth. The rotation speed of the semiconductor substrate is not particularly specified. The ion implantation energy can be appropriately adjusted in accordance with the species of impurity ion to be employed, the impurity concentration of the well, the depth of the diffusion layer and ion implantation angle. Where As is implanted at an implantation energy of about 30 KeV for the formation of $N^+$ diffusion layers, phosphorus is implanted at an implantation energy of about 160 KeV to about 200 KeV. Where $BF_2$ is implanted at an implantation energy of about 30 KeV for the formation of $P^+$ diffusion layers, boron is implanted at an implantation energy of about 80 KeV to about 120 KeV. Where the gate electrode is formed after the formation of the diffusion layers, the outer diffusion layer can be formed in self-alignment with each diffusion layer by first forming the gate electrode, then forming a resist patter of the same configuration as employed when the diffusion layer is formed, and ion-implanting with use of the resist pattern as a mask.

By thus forming the semiconductor device, two adjacent transistors can be isolated from each other without forming an LOCOS isolation film.

In a method for fabricating a mask ROM incorporating the semiconductor device of the present invention, a plurality of parallel diffusion layers are formed only within the well of the memory array region in step (i') subsequent to step (i). The diffusion layers are made to have an impurity concentration of about $1\times10^{20}/cm^3$ to about $1\times10^{21}/cm^3$ by implanting impurity ions of a conductivity type different from that of the well in a dose of about $1\times10^{15}/cm^2$ to about $3\times10^{15}/cm^2$ at an implantation energy of about 20 KeV to about 50 KeV.

In the aforesaid mask ROM fabrication method, data is written into the memory cell array in step (iv) following step (iii). The data writing to the memory cell array is achieved by masking the substrate with a resist pattern having openings only on regions provided for channel regions of transistors of desired memory cells and implanting impurity ions of a conductivity type different from that of the well through the gate electrodes. At this time, the implantation energy and impurity concentration can be appropriately adjusted so that the transistors of the memory array have a predetermined threshold voltage. Where the impurity concentration of the P-well is about $1\times10^{18}/cm^3$ to about $3\times10^{18}/cm^3$, the threshold voltage can be adjusted to about 0.2 V to about 1.0 V by implantation in a dose of about $5\times10^{13}/cm^2$ to about $7\times10^{13}/cm^2$ at an implantation energy of about 250 KeV to about 350 KeV.

Next, the semiconductor device, mask ROM and the fabrication methods therefor in accordance with the present invention will be described by way of embodiments thereof.

Figure 1:
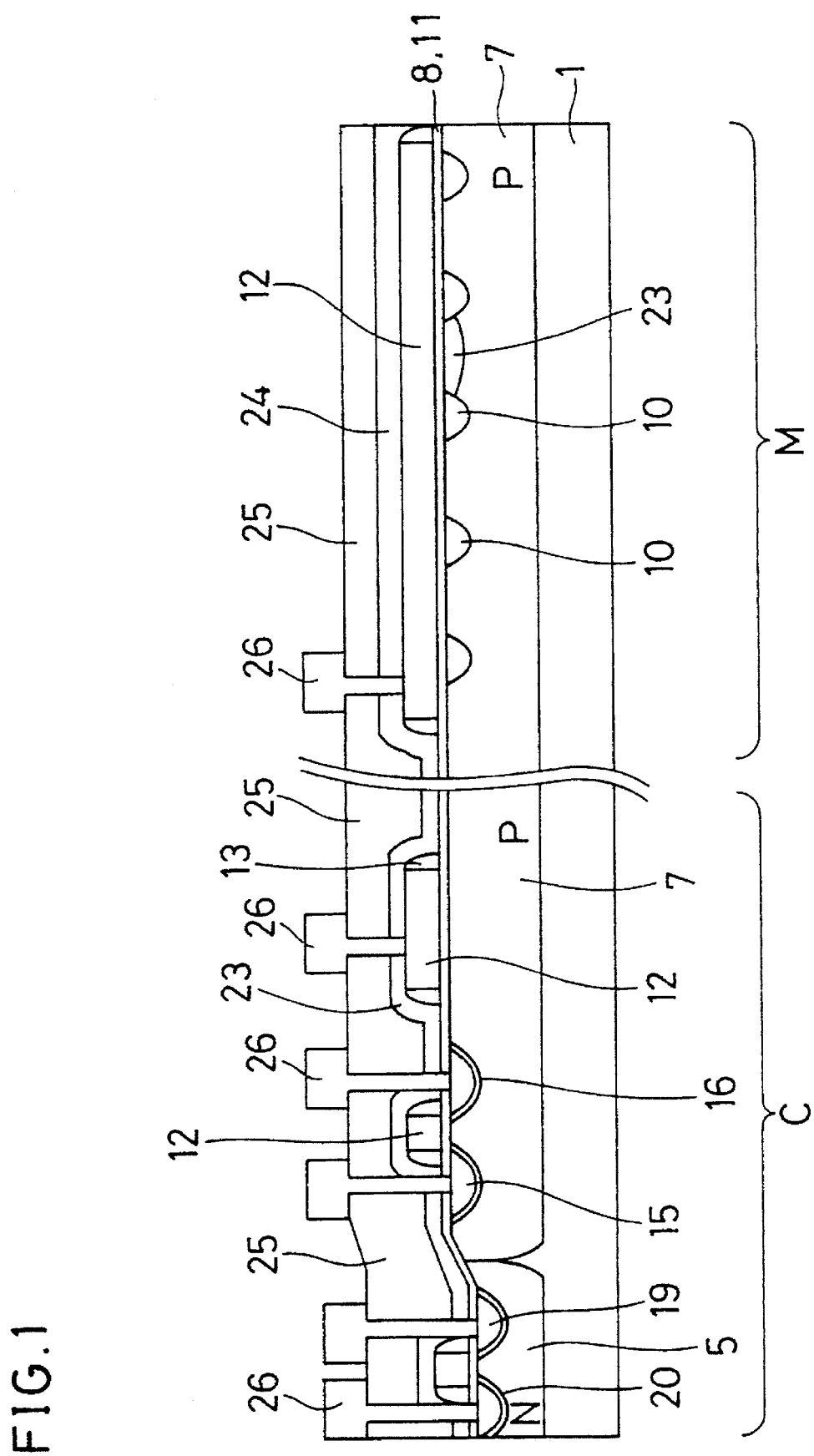
FIG. 1 is a schematic sectional view illustrating major portions of an exemplary mask ROM having a semiconductor device of the present invention in the peripheral circuitry thereof.

FIG. 1 shows a sectional view of a mask ROM incorporating the semiconductor device of the present invention in the peripheral circuitry thereof. In FIG. 1, the mask ROM includes a memory cell array M and peripheral circuitry C. In the peripheral circuitry C are formed a P-well 7 and an N-well 5, each provided with a plurality of transistors. The transistors each have a gate insulation film 8 formed on a semiconductor substrate 1, a gate electrode 12 provided with spacers on sidewalls thereof, diffusion layers 15 and 19 formed in self-alignment with the gate electrode 12. In the outer periphery of the diffusion layers 15 and 19 are formed outer diffusion layers 16 and 20 in self-alignment with the diffusion layers 15 and 19, respectively. While each of the transistors is connected to a desired interconnection layer 26 through inter-layer insulation films 24 and 25, adjacent transistors are isolated from each other by a PN junction isolation without a conventionally utilized LOCOS film. The impurity concentration at surfaces of the wells 5 and 7 is adjusted to about $2.5\times10^{18}/cm^3$, which is higher than the conventional level. The impurity concentration thus adjusted is such that the threshold voltage of a parasitic transistor appearing below the gate electrode and interconnection layer is set higher than a power supply voltage.

FIG. 2 shows the relationship between the surface impurity concentration of the P-well and the channel inversion voltage (threshold voltage) of a parasitic transistor appearing below the gate electrode under the conditions where the gate insulation film has a thickness of 200 angstrom, the ambient temperature is 25° C., and the voltage $V_{BS}$ applied between the source and the substrate is zero. As seen from FIG. 2, the well surface impurity concentration needs to be higher than $1.0\times10^{18}/cm^3$ when the power supply voltage is 3.3 V, and to be higher than $2\times10^{18}/cm^3$ when the power supply voltage is 5 V.

Figure 3:
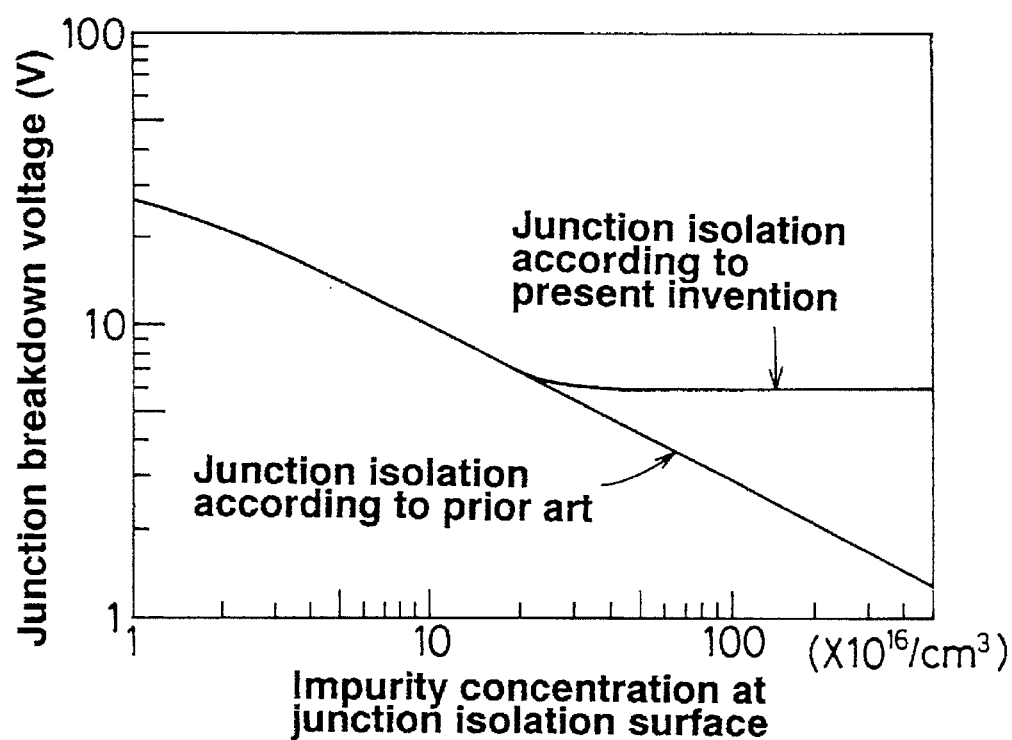
FIG. 3 is a graphical representation illustrating the relationship between the surface impurity concentration of a junction isolation and the channel inversion voltage.

As shown in FIG. 3 which illustrates the relationship between the well surface impurity concentration and the junction breakdown voltage, the junction breakdown voltage of an conventional semiconductor device decreases with increasing well surface impurity concentration. On the other hand, the junction breakdown voltage of the semiconductor device of the present invention is maintained substantially constant with increasing well surface impurity concentration, because the outer diffusion layers 16 and 20 are respectively formed in self-alignment with the diffusion layers 15 and 19 in the outer periphery thereof.

FIG. 4(a) shows an impurity concentration profile observed in a depth direction, for example, from the diffusion layer 15 through the outer diffusion layer 16 to the P-well 7. Where an ordinary transistor is formed in the P-well 7 having a high impurity concentration as shown by thin line in FIG. 4(a), the width X of a depletion layer generated when an operational voltage is applied to the transistor is small and, hence, the junction breakdown voltage is low. On the other hand, where the outer diffusion layer 16 is formed between the diffusion layer 15 and the P-well 7 having a high impurity concentration in accordance with the present invention as shown by bold line in FIG. 4(a), the width Y of the depletion layer to be generated when an operational voltage is applied to the transistor is widened and, hence, a desired junction breakdown voltage can be provided like a conventional case where the impurity concentration of the well is low as shown by dotted line in FIG. 4(a).

Figure 5:
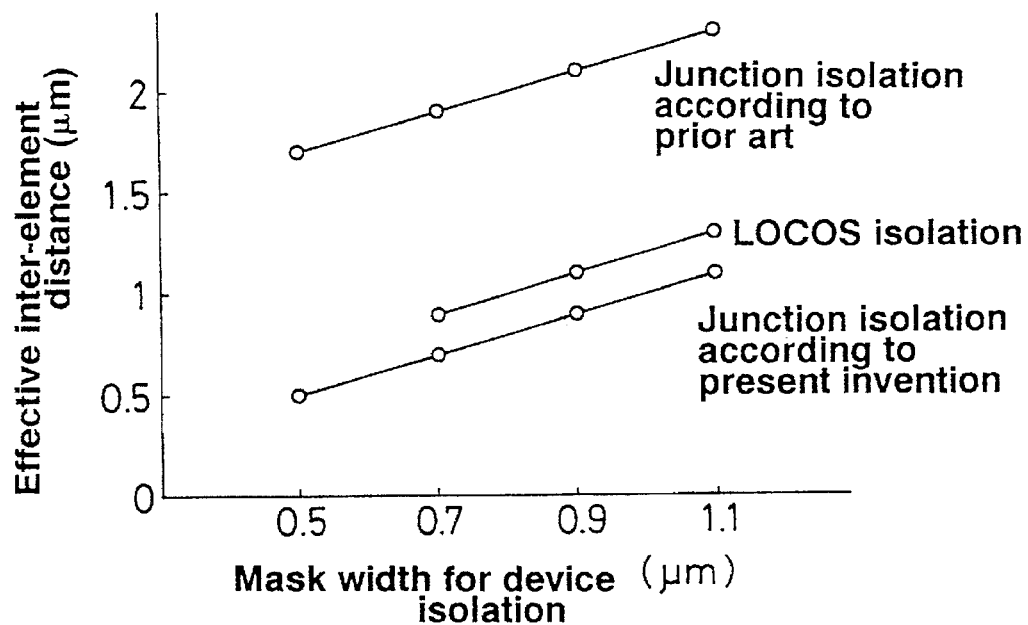
FIG. 5 is a graphical representation illustrating the relationship between the mask width for device isolation and the effective inter-element distance.
Figure 6:
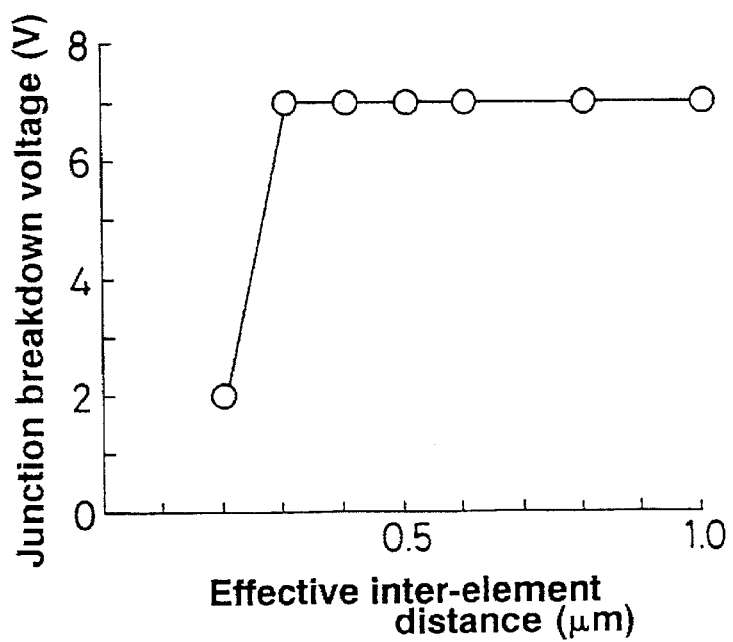
FIG. 6 is a graphical representation illustrating the relationship between the effective inter-element distance and the junction breakdown voltage.

Further, the outer diffusion layers 16 and 20 formed in self-alignment with the diffusion layers 15 and 19 permit a layout margin between the diffusion layer 15 or 19 and the PN junction isolation to be reduced down to 0 μm. This means that the diffusion layer 15 or 19 can virtually be brought into contact with the PN junction isolation via the outer diffusion layer 16 or 20. Therefore, the effective inter-element spacing can be rendered substantially the same as the width of a mask for device isolation as shown in FIG. 5. As apparent from FIG. 6, a required junction breakdown voltage can be ensured even if the effective inter-element spacing is about 0.3 μm.

In the semiconductor device of the foregoing embodiment, the reduction in the withstand voltage which may otherwise be caused by punch-through and the action of the parasitic transistor appearing below the interconnection layer can be prevented by maintaining the surface impurity concentrations of the wells 5 and 7 at high levels. The outer diffusion layers 16 and 20 respectively formed in self-alignment with the diffusion layers 15 and 19 in the outer periphery thereof reduce the junction capacitance essential to the PN junction isolation, and increases the surface impurity concentration of the wells 5 and 7. Therefore, a desired junction breakdown voltage can be ensured even if the width of the PN junction isolation is reduced. Thus, the device isolation can be achieved by way of the PN junction isolation without employing LOCOS isolation, thereby reducing the number of steps for the production of mask ROMs.

Figure 7:
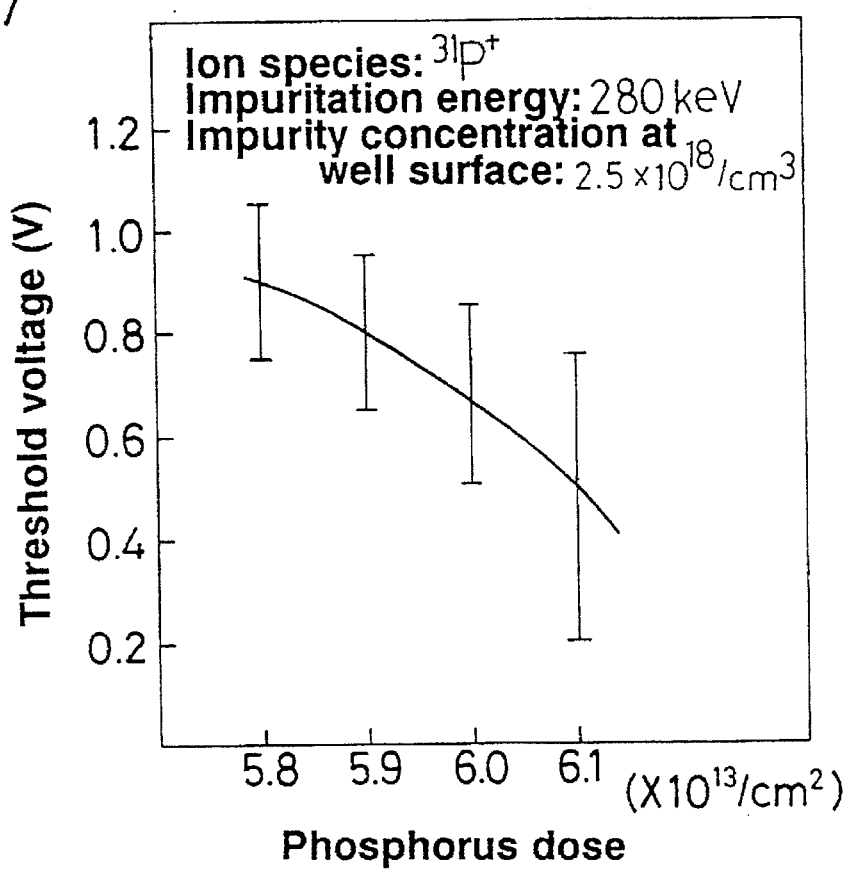
FIG. 7 is a graphical representation illustrating the relationship between the threshold voltage and the phosphorus ion dose for the data writing of a mask ROM having the semiconductor device of the present invention in the peripheral circuitry thereof.
Figure 8:
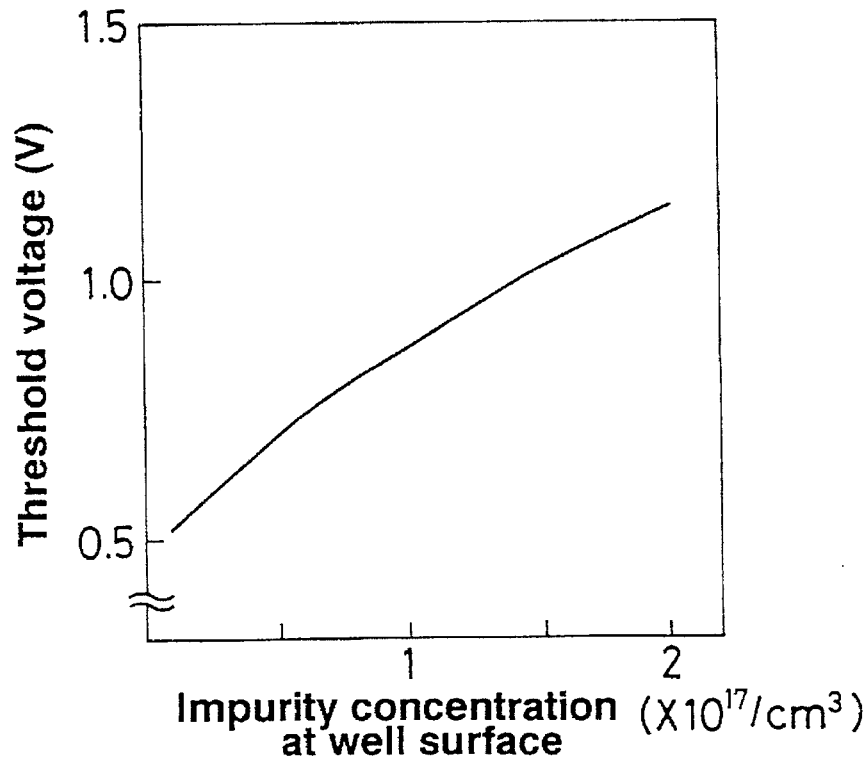
FIG. 8 is a graphical representation illustrating the relationship between the threshold voltage and the surface impurity concentration of a well observed when a data writing operation is performed on a mask ROM incorporating the semiconductor device of the present invention in the peripheral circuitry thereof.

The data writing to the memory cell array M of the mask ROM is achieved by implanting phosphorus ions into channel regions 23 of desired transistors in a dose of $6.0 \times 10^{13}/cm^2$. FIG. 7 shows the relationship between the threshold voltage of the channel region and the implantation dose under the conditions where phosphorus ions are implanted into the P-well at an implantation energy of 280 KeV for the data writing to the mask ROM and the surface impurity concentration is $2.5 \times 10^{18}/cm^3$. As can be seen from FIG. 7, the threshold voltage of the transistor is adjusted to about 0.7 V by this data writing operation. At this time, the surface impurity concentration of the well is about $0.5 \times 10^{17}/cm^3$ as shown in FIG. 8.

An explanation will be given to a method for fabricating a mask ROM incorporating the semiconductor device shown in FIG. 1.

Figure 9:
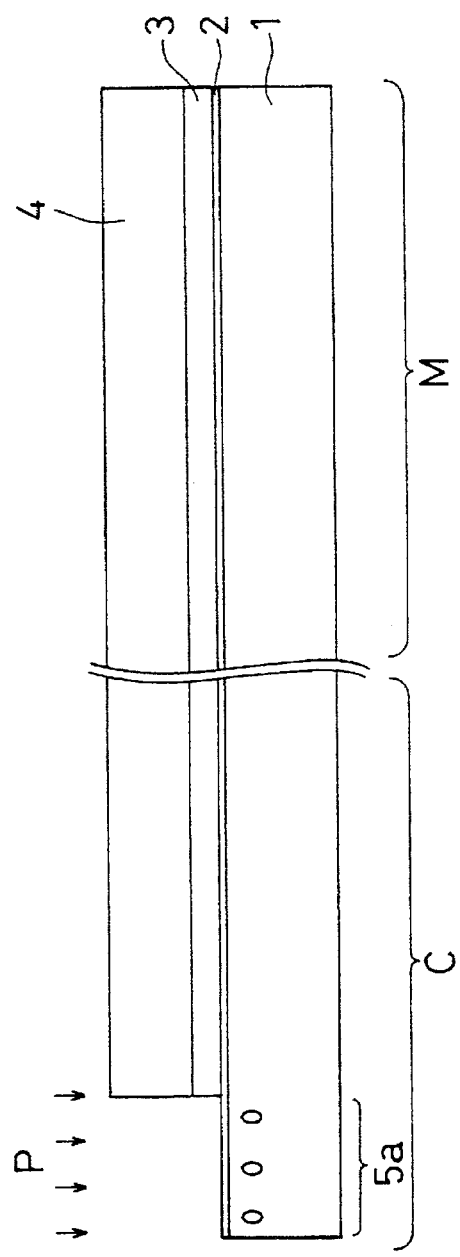
FIGS. 9 to 16 are schematic sectional views illustrating essential steps for fabricating a mask ROM incorporating the semiconductor device of the present invention in the peripheral circuitry thereof.

To form a peripheral circuitry C and a memory cell array M of the mask ROM, a thermal oxide film 2 having a thickness of 20 nm is formed on a silicon substrate 1, and then a silicon nitride film 3 having a film thickness of 120 nm is formed on the thermal oxide film 2, as shown in FIG. 9. A photoresist is applied on the silicon nitride film 3 to form a resist pattern 4. Then, the silicon nitride film 3 on an N-well formation region 5a is removed by way of photolithography and RIE method with use of the resist pattern 4 as a mask. In turn, the N-well formation region 5a is doped with phosphorus ions in a dose of $4 \times 10^{14}/cm^2$ at an implantation energy of 150 KeV with use of the silicon nitride film 3 and resist pattern 4 as masks.

Figure 10:
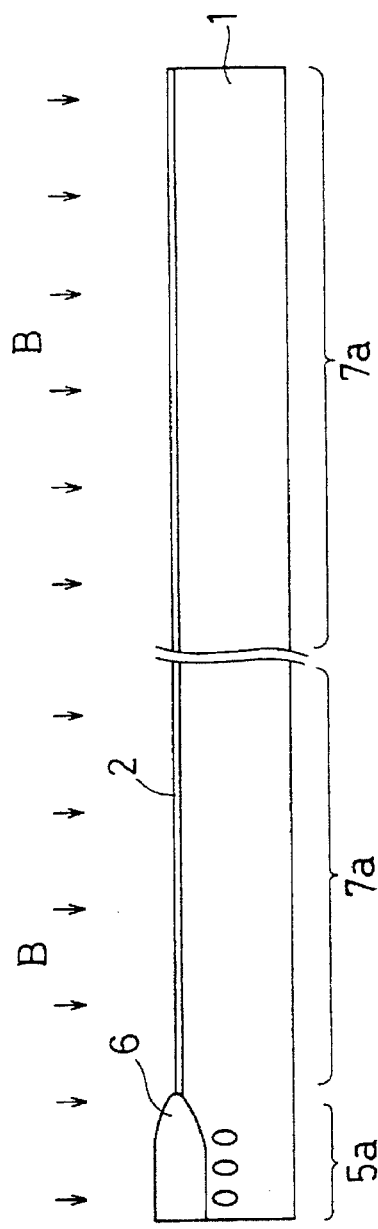
Figure 11:
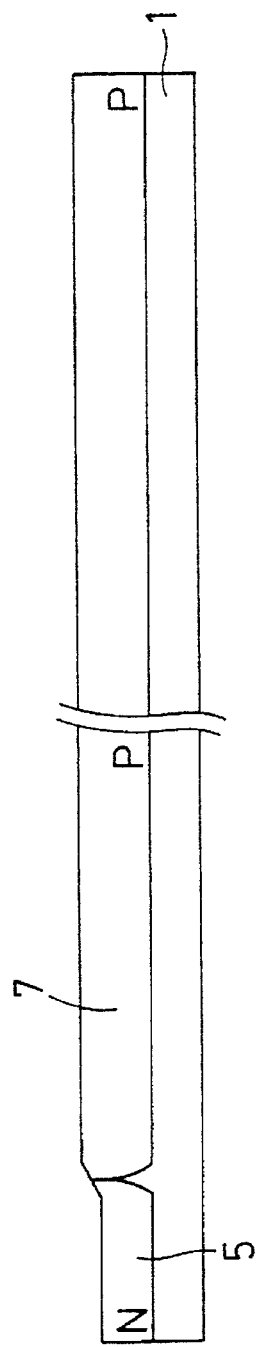

After the resist pattern 4 is removed, an LOCOS film 6 having a film thickness of 360 nm is formed by way of pyrolytic oxidation, followed by removal of the silicon nitride film 3 with hot phosphorous acid, as shown in FIG. 10. A P-well formation region 7a is doped with boron ions in a dose of $1.38 \times 10^{14}/cm^2$ at an implantation energy of 20 KeV with use of the LOCOS film 6 as a mask. In turn, the substrate is annealed at a temperature of 1100° C. for two hours for the drive-in of wells to form an N-well 5 and a P-well 7 as shown in FIG. 11. At this time, the surface impurity concentrations of the N-well 5 and P-well 7 are adjusted to $2.5 \times 10^{18}/cm^3$, which is higher than in a conventional concentration. The LOCOS film 6 and thermal oxide film 2 are then removed by hydrofluoric acid.

Figure 12:
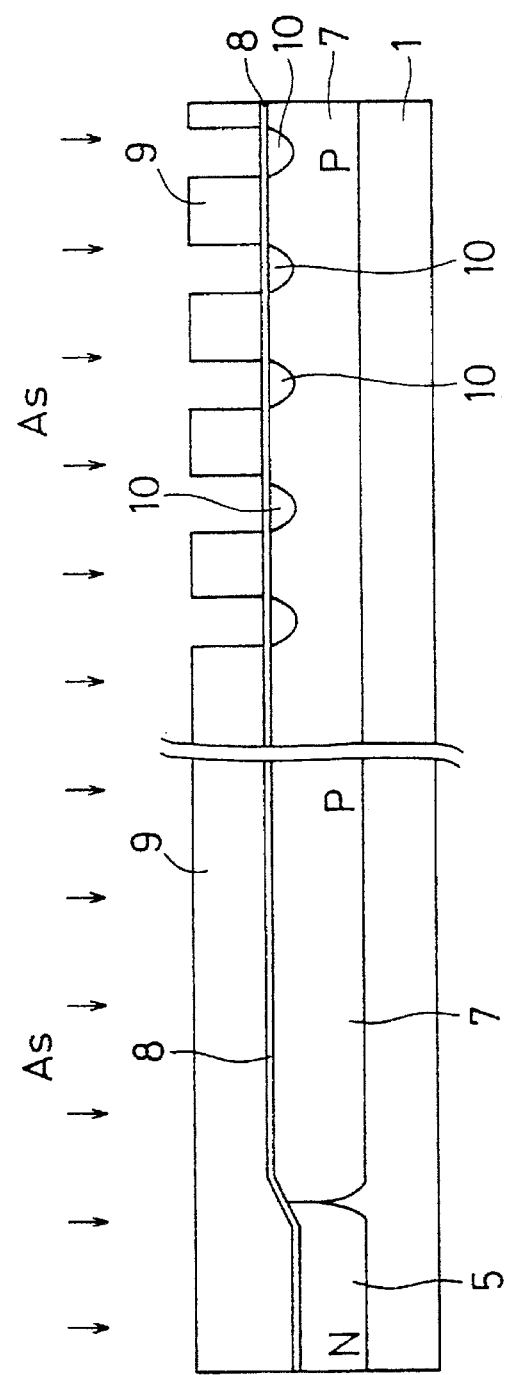

In turn, an oxide film 8 having a thickness of 20 nm is formed on the entire surface of the silicon substrate 1 as shown in FIG. 12. A resist is applied on the oxide film 8, and formed into a resist pattern 9 by way of photolithography. The memory cell array M is doped with arsenic ions in a dose of $3 \times 10^{15}/cm^2$ at an implantation energy of 40 KeV with use of the resist pattern 9 as a mask to form a diffused bit line interconnection layer 10.

Figure 13:
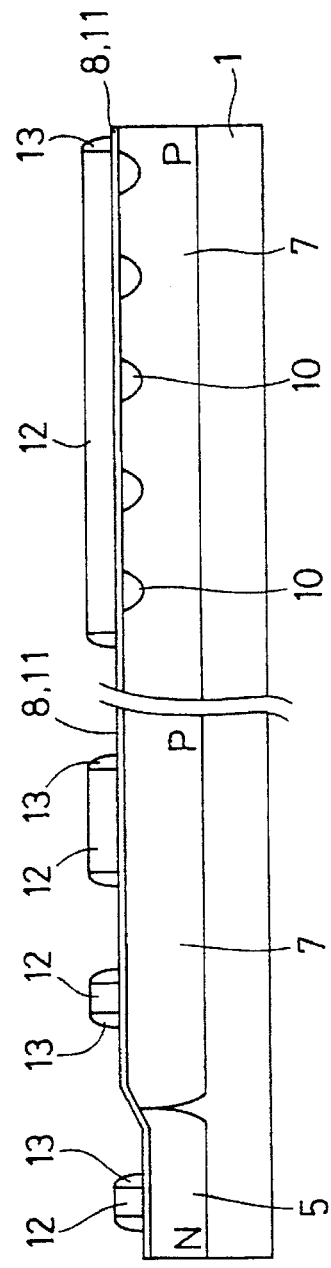

After the resist pattern 9 is removed, a gate oxide film 11 having a thickness of 20 nm and a polysilicon film having a thickness of 350 nm are successively formed on the oxide film 8 in a usual manner as shown in FIG. 13. Then, after diffusing phosphorus ions, the polysilicon film is patterned into a desired configuration to form a gate electrode 12. In turn, an oxide film is deposited on the gate electrode 12 and etched by way of RIE to form spacers 13.

Figure 14:
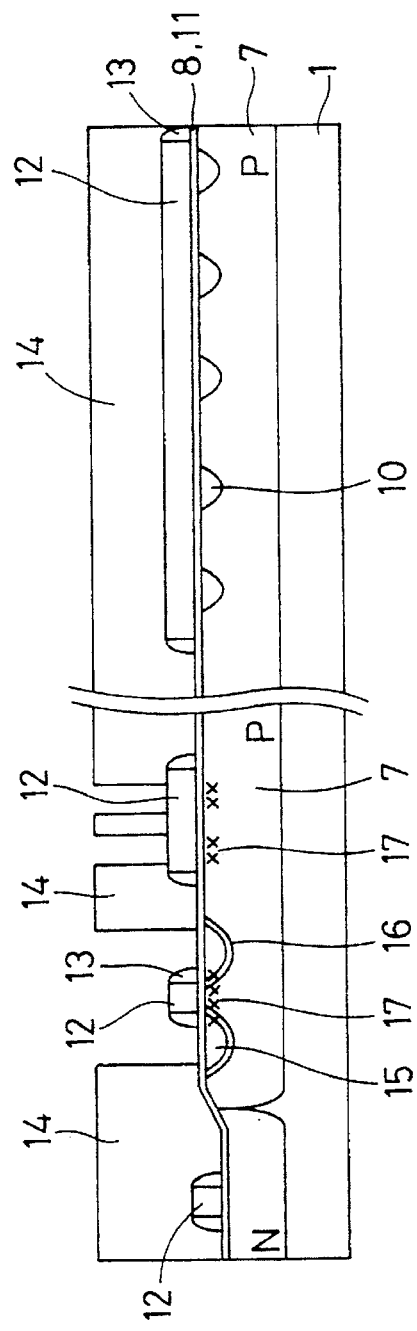

Thereafter, a mask pattern 14 is formed of a photoresist for the formation of N$^+$ diffusion layers as shown in FIG. 14. Although a conventional mask pattern covers only the N-well of the peripheral circuitry and is formed with a large window on the other regions, the mask pattern 14 in accordance with the present invention has windows only on the regions on the P-well 7 in which respective transistors are to be formed. By using the mask pattern 14, phosphorus ions are implanted into the substrate in a dose of $3 \times 10^{15}/cm^2$ at an implantation energy of 30 KeV to form N$^+$ diffusion layers 15. By reusing the mask pattern 14, phosphorus ions are implanted into the substrate in a dose of $4 \times 10^{14}/cm^2$ at an implantation energy of 200 KeV and at an angle of 60° with respect to a normal line of a surface of the substrate 1 to form outer diffusion layers 16 in the P-well 7 while the substrate is rotated about the center of the substrate (wafer). In order to adjust the threshold voltage of the transistor, phosphorus ions are implanted into a region below the gate electrode 12 in a dose of $6 \times 10^{13}/cm^2$ at an implantation energy of 280 KeV to form a channel region 17 by reusing the mask pattern 14. Thus, the outer diffusion layer 16 can be formed only in the outer periphery of the N$^+$ diffusion layers 15 in self-alignment therewith by reusing the mask pattern for the formation of the N$^+$ diffusion layers 15. The present invention realizes an improved junction breakdown voltage and reduced junction capacitance, even if the P-well has an impurity concentration higher than that of a conventional well.

Figure 15:
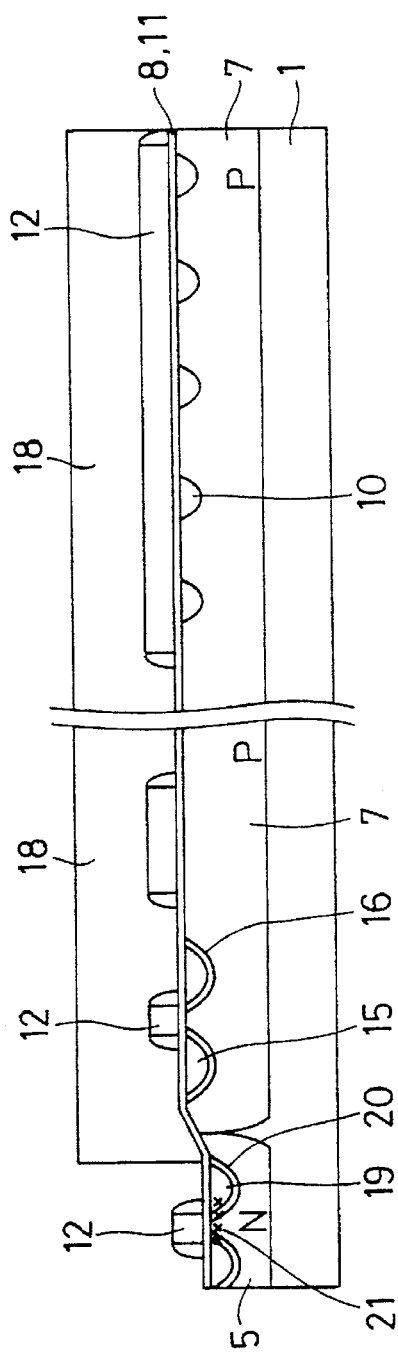

Next, a mask pattern 18 is formed of a photoresist for the formation of P$^+$ diffusion layers as shown in FIG. 15. Although a conventional mask pattern covers only the P-well and is formed with a large window on the other regions, the mask pattern 18 in accordance with the present invention has windows only on the regions on the N-well 5 in which respective transistors are to be formed. By using the mask pattern 18, boron ions are implanted into the substrate in a dose of $2\times10^{15}$/cm$^2$ at an implantation energy of 50 KeV to form P$^+$ diffusion layers 19. By reusing the mask pattern 18, boron ions are implanted into the substrate in a dose of $1.6\times10^{14}$/cm$^2$ at an implantation energy of 100 KeV and at an angle of 60° with respect to a normal line of a surface of the substrate to form an outer diffusion layer 20 in the N-well 5 while the substrate is rotated about the center of the substrate (wafer). In order to adjust the threshold voltage of the transistor, boron ions are implanted into the substrate in a dose of $4.6\times10^{13}$/cm$^2$ at an implantation energy of 120 KeV to form a channel region 21 by reusing the mask pattern 18. Thus, the outer diffusion layers 20 can be formed only in the outer peripheries of the P$^+$ diffusion layers 19 in self-alignment therewith by reusing the mask pattern for the formation of the N$^+$ diffusion layers 19. The present invention realizes an improved junction breakdown voltage and reduced junction capacitance, even if the N-well has an impurity concentration higher than that of a conventional well. Like the case of the P-well 7, the device isolation can be achieved by way of the PN junction isolation without employing LOCOS isolation, thereby reducing the number of steps for the fabrication of mask ROMs.

Figure 16:
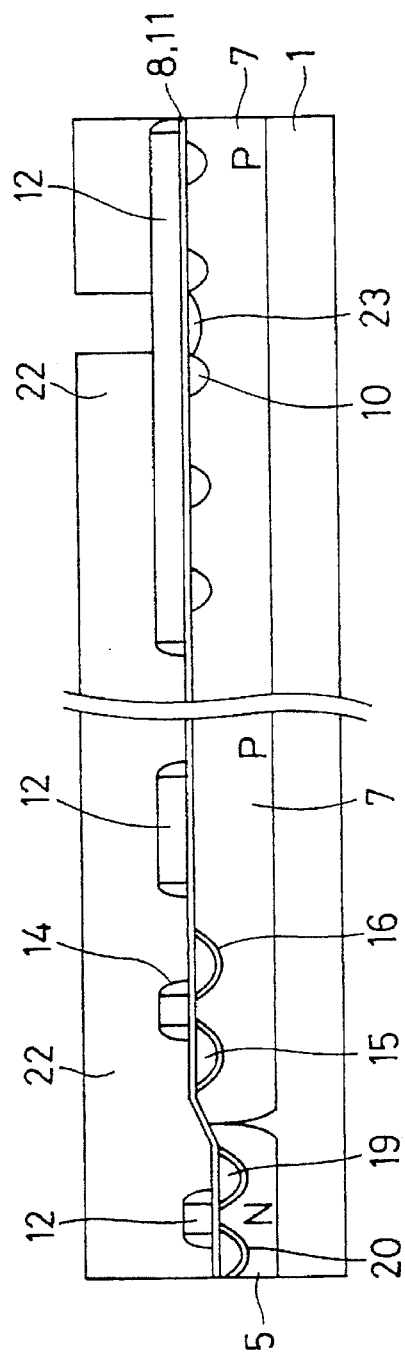
Figure 17:
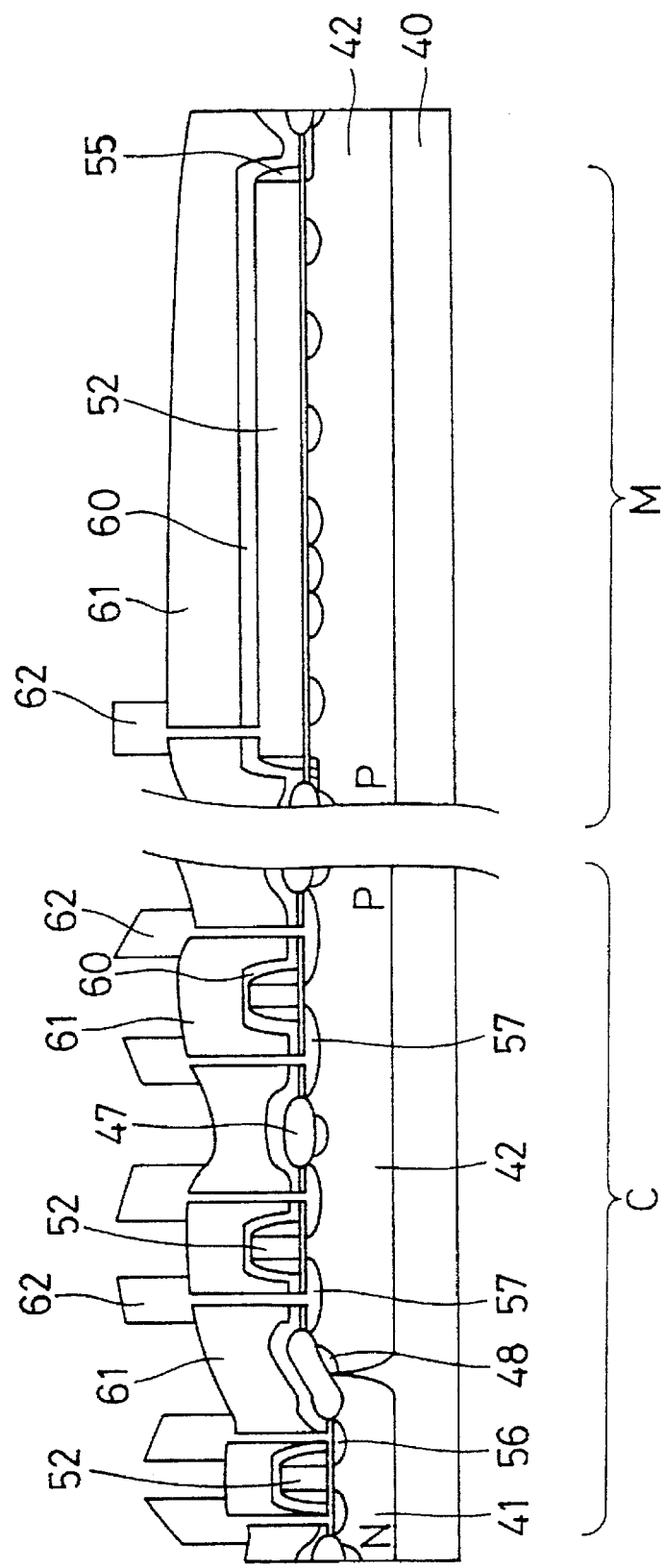
FIG. 17 is a schematic sectional view illustrating major portions of a conventional mask ROM.
Figure 18:
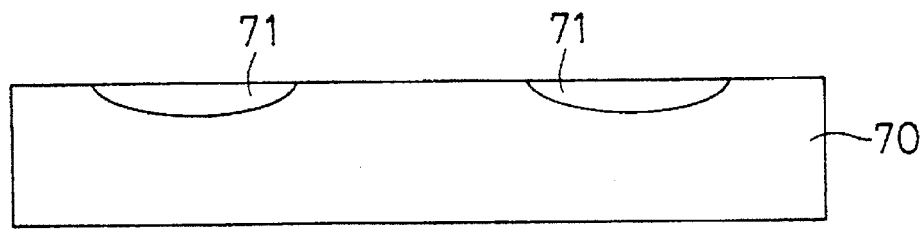
FIGS. 18 to 20 are schematic sectional views illustrating essential steps for achieving a junction isolation in a conventional semiconductor device.
Figure 19:
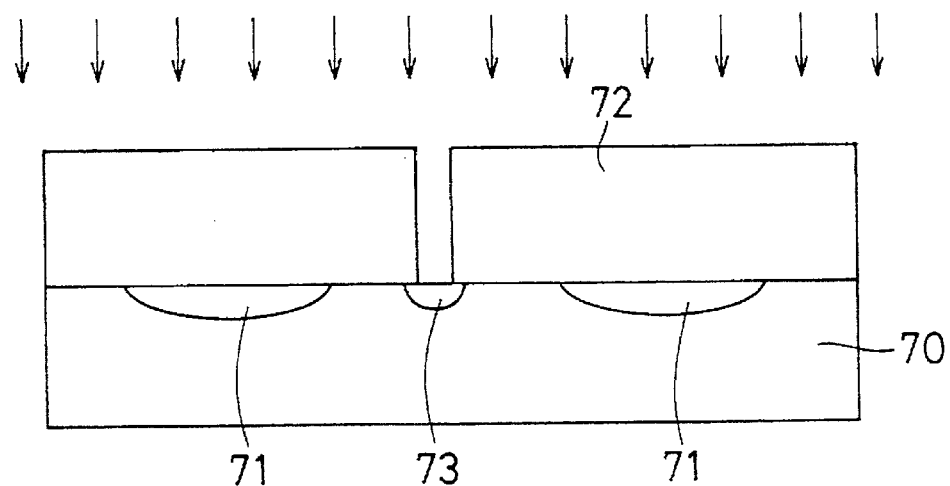
Figure 20:
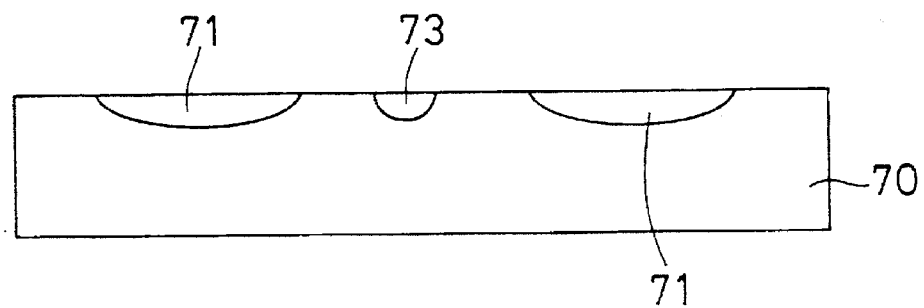
Figure 21:
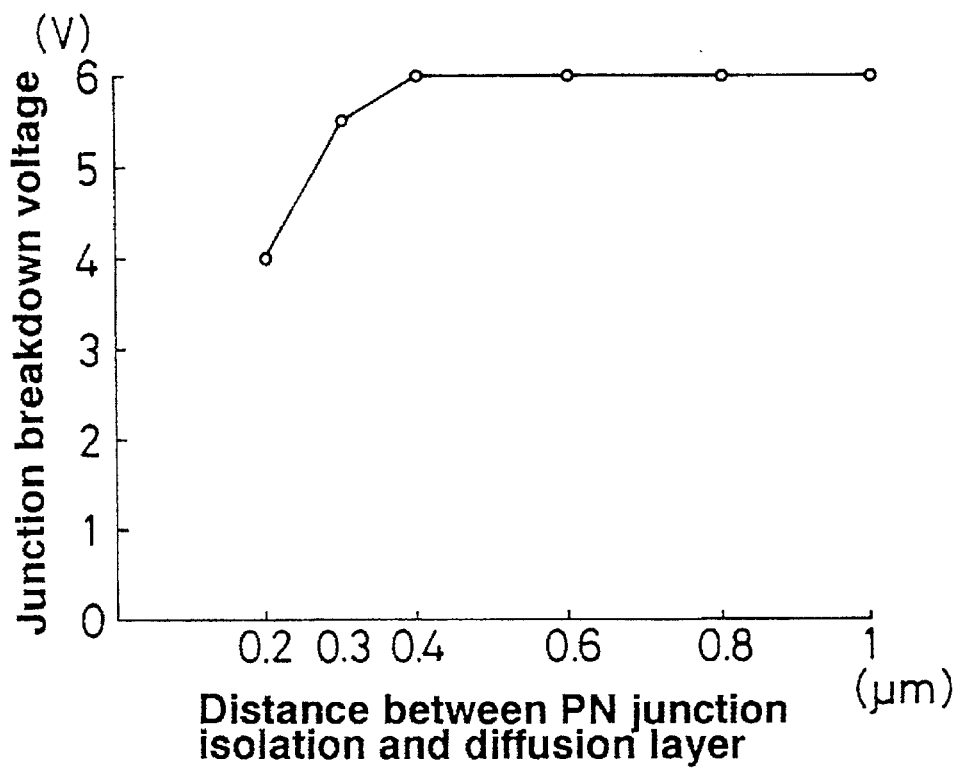
FIG. 21 is a graphical representation illustrating the relationship between the junction breakdown voltage and the spacing between PN junction isolation and diffusion layer in accordance with the prior art.
Figure 22:
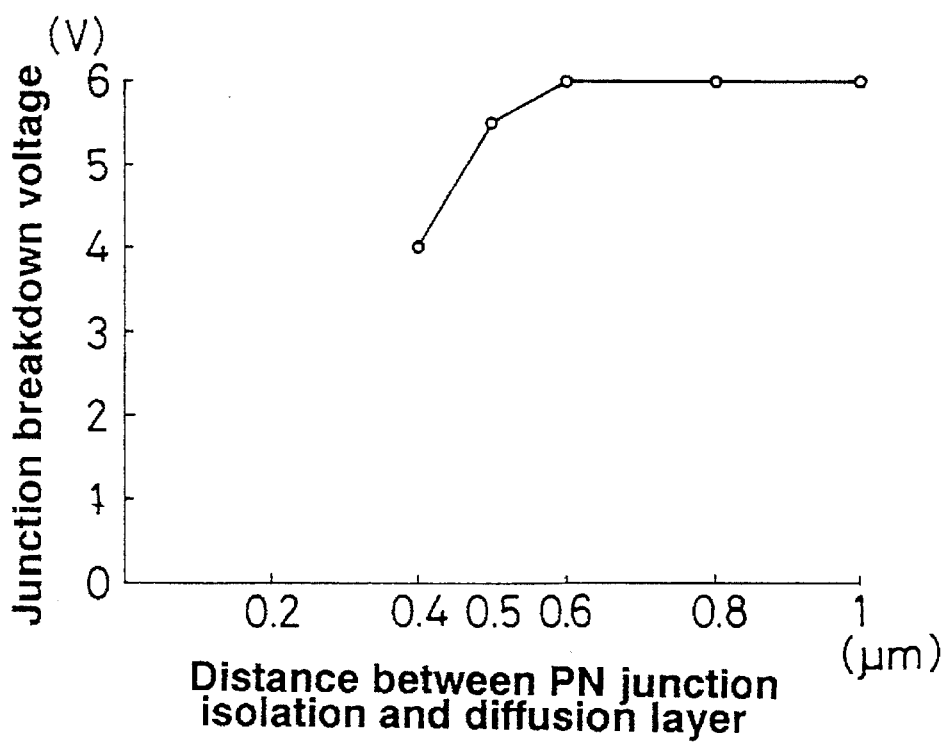
FIG. 22 is a graphical representation illustrating the relationship between the junction breakdown voltage and the spacing between PN junction isolation and diffusion layer when an overlap margin and lateral impurity diffusion from the isolation diffusion layer are taken into consideration in the prior art.

Next, phosphorus ions are implanted into the channel regions of desired transistors in the memory cell array in a dose of $6\times10^{13}$/cm$^2$ with use of a photoresist 22 as a mask, thereby writing data into the memory cell array M, as shown in FIG. 16.

After the substrate is subjected to a heat treatment for the activation of ions thus implanted and the recovery of crystallinity of the substrate, an NSG film 24 and a BPSG film 25 are deposited on the substrate as inter-layer insulation films, then contact holes are formed, followed by the formation of metal interconnection 26. Thus, the mask ROM shown in FIG. 1 is completed.

In accordance with the present invention, the impurity concentrations of the wells are adjusted relatively high so that the threshold voltage of the parasitic transistor appearing below the gate electrode interconnecting transistors is set to higher than a power supply voltage. Therefore, a reduction in the junction breakdown voltage which may otherwise be caused due to punch-through and the action of the parasitic transistor can be prevented. Further, since the outer diffusion layers are respectively formed in self-alignment with the diffusion layers in the outer periphery thereof, the junction capacitance of the PN junction isolation can be reduced even if the wells have a high surface impurity concentration. Therefore, a desired junction breakdown voltage can be ensured even if the width of the PN junction isolation is reduced. Thus, the isolation of adjacent transistors can be achieved by way of the PN junction isolation without employing the LOCOS isolation, thereby realizing a highly reliable semiconductor device which has a planarized surface and permits highly dense integration.

The semiconductor device of the present invention incorporated in the peripheral circuitry of a mask ROM realizes a flat memory having a memory cell array without providing an LOCOS isolation, thereby realizing a highly reliable mask ROM which permits highly dense integration.

The method for fabricating a semiconductor device in accordance with the present invention realizes, without employing the LOCOS isolation, a junction isolation such that the junction breakdown voltage and junction capacity are properly controlled to virtually avoid operational problems.

The method for fabricating a semiconductor device incorporated in a mask ROM in accordance with the present invention can reduce the production period and the production cost, because the device isolation is achieved by reusing a mask for the formation of the memory cell array. The surface of the fabricated peripheral circuitry is planarized because the LOCOS isolation is not employed. Therefore, a highly reliable mask ROM permitting a highly dense integration can be fabricated at a high yield.

While only certain presently preferred embodiments have been described in detail, certain changes and modifications can be made in the embodiments without departing from the spirit and scope of the present invention as defined by the following claims.

What is claimed is:

1. A semiconductor device comprising:

a semiconductor substrate formed with at least one well containing impurity ions of one of a first conductivity type and a second conductivity type;

a plurality of transistors each having a gate insulation film formed on the well, a gate electrode formed on the gate insulation film and a pair of diffusion layers formed in the well; and an outer diffusion layer of the same conductivity type as that of the well and self-aligned with each of the diffusion layers in an outer periphery thereof within the well;

said outer diffusion layer having an impurity concentration sufficient to provide a desired junction breakdown voltage and having substantially the same width as that of a depletion layer to be generated when an operational voltage is applied to the corresponding transistor;

said impurity of the well being set for a concentration such that a threshold voltage of a parasitic transistor appearing below the gate electrode connecting adjacent transistors is higher than a power supply voltage, whereby the adjacent transistors are isolated from each other.

2. A semiconductor device of claim 1, wherein the well of said one of the first conductivity type and the second conductivity type has an impurity concentration of $1\times10^{18}$/cm$^3$ to $3\times10^{18}$/cm$^3$.

3. A mask ROM comprising a memory cell array and peripheral circuitry which incorporates therein a semiconductor device comprising:

a semiconductor substrate formed with at least one well containing impurity ions of one of a first conductivity type and a second conductivity type;

a plurality of transistors each having a gate insulation film formed on the well, a gate electrode formed on the gate insulation film and a pair of diffusion layers formed in the well; and an outer diffusion layer of the same conductivity type as that of the well and self-aligned with each of the diffusion layers in an outer periphery thereof within the well;

said outer diffusion layer having an impurity concentration sufficient to provide a desired junction breakdown voltage and having substantially the same width as that of a depletion layer to be generated when an operational voltage is applied to the corresponding transistor;

said impurity of the well being set for a concentration such that a threshold voltage of a parasitic transistor appearing below the gate electrode connecting adjacent transistors is higher than a power supply voltage, whereby the adjacent transistors are isolated from each other.

4. A mask ROM of claim 3, wherein the well of said one of the first conductivity type and the second conductivity type has an impurity concentration of $1\times10^{18}/cm^3$ to $3\times10^{18}/cm^3$.

* * * * *